(12) United States Patent
Nishikawa et al.

(10) Patent No.: US 12,158,313 B2
(45) Date of Patent: Dec. 3, 2024

(54) COOLING DEVICE

(71) Applicant: Nidec Corporation, Kyoto (JP)

(72) Inventors: Kazuhiro Nishikawa, Kyoto (JP); Koji Murakami, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 271 days.

(21) Appl. No.: 17/901,027

(22) Filed: Sep. 1, 2022

(65) Prior Publication Data

US 2023/0077047 A1    Mar. 9, 2023

(30) Foreign Application Priority Data

Sep. 6, 2021    (JP) ................................. 2021-144426

(51) Int. Cl.
*F28F 3/12*    (2006.01)
*F28D 21/00*    (2006.01)

(52) U.S. Cl.
CPC ............... *F28F 3/12* (2013.01); *F28D 21/00* (2013.01); *F28D 2021/0028* (2013.01)

(58) Field of Classification Search
CPC ..... F28F 3/12; F28D 21/00; F28D 2021/0028
See application file for complete search history.

(56) References Cited

U.S. PATENT DOCUMENTS

| | | | | |
|---|---|---|---|---|
| 7,000,684 B2 * | 2/2006 | Kenny | ................... | H01L 23/473 174/15.1 |
| 2020/0286812 A1 * | 9/2020 | Tochiyama | ............ | H05K 7/209 |
| 2022/0377939 A1 | 11/2022 | Uchibe | | |
| 2023/0077047 A1 * | 3/2023 | Nishikawa | ............ | H01L 23/473 |
| 2023/0204305 A1 * | 6/2023 | Hori | ......................... | F28F 3/02 165/104.11 |
| 2023/0298967 A1 * | 9/2023 | Hori | ...................... | H01L 23/473 361/699 |
| 2023/0324129 A1 * | 10/2023 | Nishikawa | ............ | F28D 15/00 165/80.4 |
| 2023/0324132 A1 * | 10/2023 | Inoue | ................. | H05K 7/20254 |
| 2023/0324133 A1 * | 10/2023 | Hori | ......................... | F28F 3/12 165/104.19 |
| 2024/0200888 A1 * | 6/2024 | Matsuda | ................... | F28F 3/12 |

FOREIGN PATENT DOCUMENTS

| | | | | |
|---|---|---|---|---|
| EP | 4064336 A1 * | 9/2022 | ........ | H01L 23/3672 |
| JP | 2015-220382 A | 12/2015 | | |
| JP | 2022-178315 A | 12/2022 | | |

* cited by examiner

*Primary Examiner* — Claire E Rojohn, III
(74) *Attorney, Agent, or Firm* — Keating & Bennett, LLP

(57) ABSTRACT

A liquid cooling jacket includes a base portion and a protruding portion protruding from an end surface on a first side in a third direction of the base portion in the third direction. A heat dissipation assembly includes a recessed portion recessed from an end surface on a second side in the third direction. A refrigerant flow path having a width in the second direction is between the end surface on the first side in the third direction of the base portion and the end surface on the second side in the third direction of the heat dissipation assembly. A position of the recessed portion coincides with a position of the protruding portion. An end portion of the protruding portion is farther on the second side in the first direction than an end portion on the first side in the first direction of the recessed portion.

16 Claims, 9 Drawing Sheets

COOLING DEVICE

CROSS-REFERENCE TO RELATED APPLICATIONS

The present application claims priority under 35 U.S.C. § 119 to Japanese Patent Application No. 2021-144426, filed on Sep. 6, 2021, the entire contents of which are hereby incorporated herein by reference.

1. Field of the Invention

The present disclosure relates to a cooling device.

2. Background

Conventionally, a cooling device including a heat dissipation member and a water jacket has been known. The heat dissipation member includes a cooling fin. The cooling fin is accommodated in the water jacket. The inside of the water jacket serves as a flow path of cooling water, and a heating element is water-cooled via the cooling fin.

However, when the cooling fin is provided in the heat dissipation member as described above, there have been a problem that pressure loss increases and a problem that manufacturing cost increases.

SUMMARY

A cooling device according to an example embodiment of the present disclosure includes a liquid cooling jacket and a heat dissipation assembly on a first side in a third direction of the liquid cooling jacket, where a direction along which a refrigerant flows is defined as a first direction, a direction orthogonal to the first direction is defined as a second direction, and a direction orthogonal to the first direction and the second direction is defined as the third direction, and a downstream side is defined as a first side in the first direction, and an upstream side is defined as a second side in the first direction. The liquid cooling jacket includes a base portion and a protruding portion protruding from an end surface on the first side in the third direction of the base portion to the first side in the third direction. The heat dissipation assembly includes a recessed portion recessed from an end surface on a second side in the third direction of the heat dissipation assembly to the first side in the third direction. A refrigerant flow path having a width in the second direction is between the end surface on the first side in the third direction of the base portion and the end surface on the second side in the third direction of the heat dissipation assembly. A position in the second direction of at least a portion of the recessed portion coincides with a position in the second direction of at least a portion of the protruding portion. An end portion on the second side in the first direction of the protruding portion is farther on the second side in the first direction than an end portion on the first side in the first direction of the recessed portion.

The above and other elements, features, steps, characteristics and advantages of the present disclosure will become more apparent from the following detailed description of the example embodiments with reference to the attached drawings.

DETAILED DESCRIPTION

Figure 1:
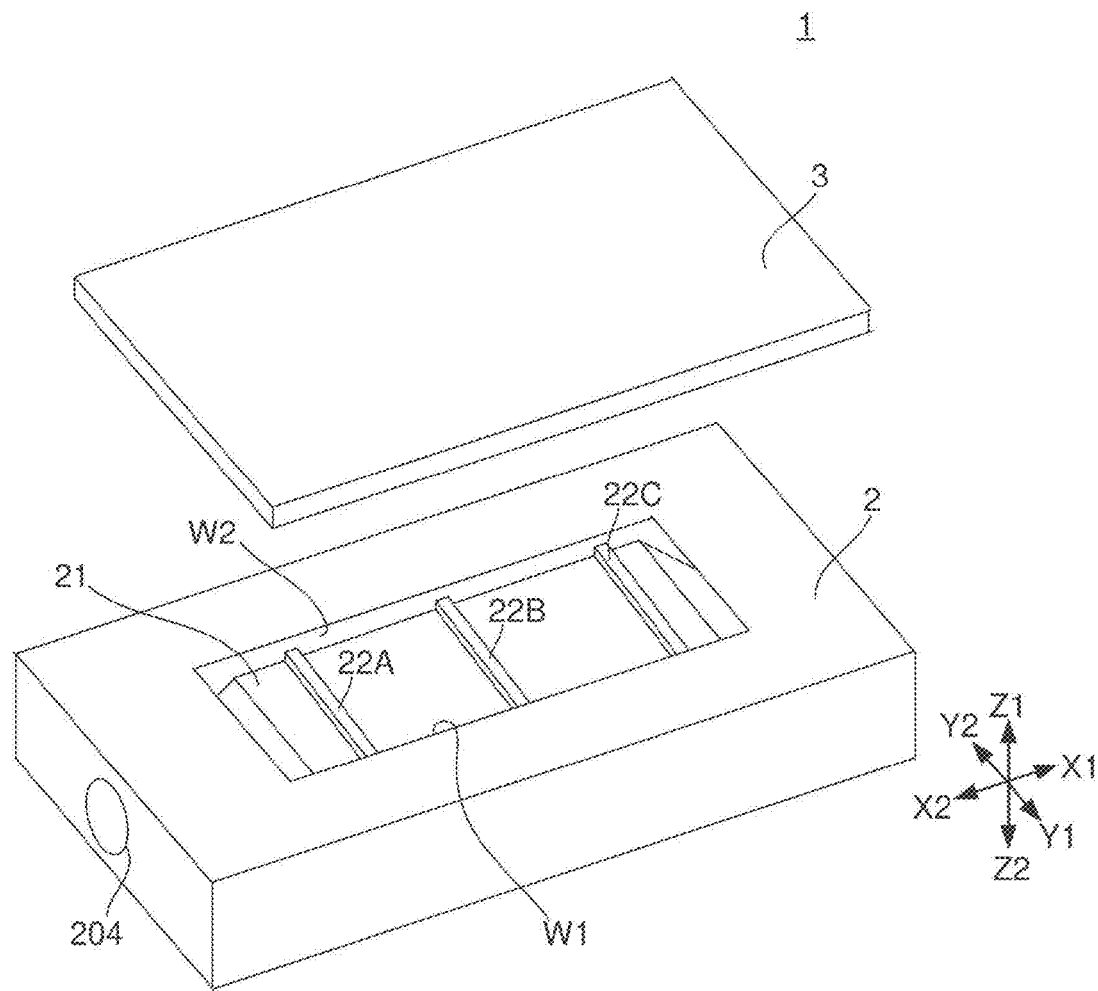
FIG. 1 is an exploded perspective view of a cooling device according to an example embodiment of the present disclosure.

Hereinafter, example embodiments of the present disclosure will be described with reference to the drawings.

In the drawings, with the first direction as an X direction, X1 indicates a first side in the first direction, and X2 indicates a second side in the first direction. The first direction is a direction along a direction F in which a refrigerant W flows, and the downstream side is indicated by F1 and the upstream side is indicated by F2. The downstream side F1 is the first side in the first direction, and the upstream side F2 is the second side in the first direction. With the second direction orthogonal to the first direction as a Y direction, Y1 indicates a first side in the second direction, and Y2 indicates a second side in the second direction. With the third direction orthogonal to the first direction and the second direction as a Z direction, Z1 indicates a first side in the third direction, and 22 indicates a second side in the third direction. Note that the above-described "orthogonal" also includes intersection at an angle slightly shifted from 90 degrees. Each of the above-described directions does not limit a direction when a cooling device 1 is incorporated in various devices.

Figure 2:
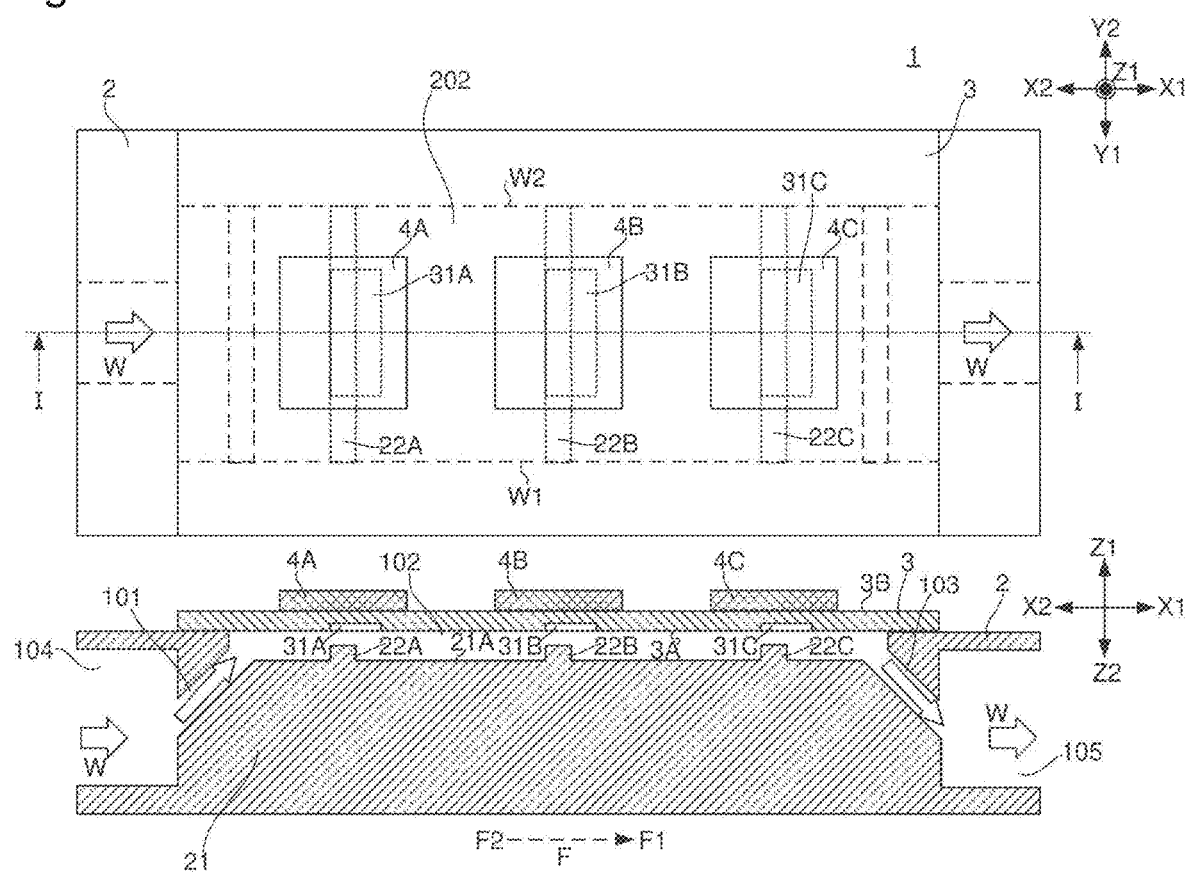
FIG. 2 is a plan view and a cross-sectional view taken along line I-I of a cooling device according to an example embodiment of the present disclosure.

FIG. 1 is an exploded perspective view of a cooling device 1 according to an example embodiment of the present disclosure. FIG. 2 is a plan view (upper diagram) and a side sectional view taken along line I-I (lower diagram) of the cooling device 1 as viewed from the first side in the third direction. As illustrated in FIG. 2, the line I-I is a center line passing through the center position in the second direction in the plan view of the cooling device 1.

The cooling device 1 includes a liquid cooling jacket 2 and a heat dissipation assembly 3. The cooling device 1 is a device that cools a plurality of heating elements 4A, 4B, and 4C with the refrigerant W. The refrigerant W is liquid such as water. That is, the cooling device 1 performs liquid cooling such as water cooling. The number of heating elements may be a plural number other than three, or may be singular.

The liquid cooling jacket 2 has a rectangular parallelepiped shape having sides extending in the first direction, the second direction, and the third direction. The liquid cooling jacket 2 is, for example, a die-cast product made from metal such as aluminum. The liquid cooling jacket 2 includes a base portion 21.

The cooling device 1 has a flow path through which the refrigerant W flows. Specifically, the cooling device 1 includes a first refrigerant flow path 101, a second refrigerant flow path 102, a third refrigerant flow path 103, an inlet flow path 104, and an outlet flow path 105.

The inlet flow path 104 is provided in the liquid cooling jacket 2. The inlet flow path 104 is arranged in an end portion on the second side in the first direction of the liquid cooling jacket 2 and has a columnar shape extending in the first direction. The inlet flow path 104 is arranged on the second side in the first direction of the base portion 21.

The first refrigerant flow path 101 is provided in the liquid cooling jacket 2. The first refrigerant flow path 101 has a width in the second direction and is inclined to the first side in the first direction and the first side in the third direction. The first refrigerant flow path 101 is arranged on the first side in the third direction of the base portion 21. An end portion on the second side in the first direction of the first refrigerant flow path 101 is connected to an end portion on the first side in the first direction of the inlet flow path 104.

Here, the heat dissipation assembly 3 is a rectangular parallelepiped flat plate having sides extending in the first direction, the second direction, and the third direction, and has thickness in the third direction. The heat dissipation assembly 3 is, for example, a copper plate. The heat dissipation assembly 3 is arranged on the first side in the third direction of the liquid cooling jacket 2.

In a state where the heat dissipation assembly 3 is not attached to the liquid cooling jacket 2, the first side in the third direction of the base portion 21 is exposed to the outside. As the heat dissipation assembly 3 is attached to the liquid cooling jacket 2, a space as the second refrigerant flow path 102 is formed between the heat dissipation assembly 3 and the base portion 21. That is, the second refrigerant flow path 102 is arranged between an end surface 21A on the first side in the third direction of the base portion 21 and an end surface 3A on the second side in the third direction of the heat dissipation assembly 3. The second refrigerant flow path 102 has a width in the second direction and extends in the first direction. An end portion on the second side in the first direction of the second refrigerant flow path 102 is connected to an end portion on the first side in the first direction of the first refrigerant flow path 101.

The third refrigerant flow path 103 is provided in the liquid cooling jacket 2. The third refrigerant flow path 103 has a width in the second direction and is inclined to the first side in the first direction and the second side in the third direction. The third refrigerant flow path 103 is arranged on the first side in the third direction of the base portion 21. An end portion on the second side in the first direction of the third refrigerant flow path 103 is connected to an end portion on the first side in the first direction of the second refrigerant flow path 102.

The outlet flow path 105 is provided in the liquid cooling jacket 2. The outlet flow path 105 is arranged in an end portion on the first side in the first direction of the liquid cooling jacket 2 and has a columnar shape extending in the first direction. The outlet flow path 105 is arranged on the first side in the first direction of the base portion 21. An end portion on the second side in the first direction of the outlet flow path 105 is connected to an end portion on the first side in the first direction of the third refrigerant flow path 103.

In this manner, the refrigerant W flowing into the inlet flow path 104 flows into the first refrigerant flow path 101 and flows to the first side in the first direction and the first side in the third direction in the first refrigerant flow path 101, flows into the second refrigerant flow path 102 and flows to the first side in the first direction in the second refrigerant flow path 102, flows into the third refrigerant flow path 103 and flows to the first side in the first direction and the second side in the third direction in the third refrigerant flow path 103, and flows into the outlet flow path 105 and is discharged to the outside of the liquid cooling jacket 2.

The heating elements 4A, 4B, and 4C (hereinafter, 4A and the like) are arranged side by side in this order on the first side in the first direction. The heating elements 4A and the like are in direct or indirect contact with an end surface 3B on the first side in the third direction of the heat dissipation assembly 3. Heat generated from the heating elements 4A and the like is transmitted to the refrigerant W flowing through the second refrigerant flow path 102 via the heat dissipation assembly 3, so that the heating elements 4A and the like are cooled.

The liquid cooling jacket 2 has protruding portions 22A, 22B, and 22C (hereinafter, 22A and the like) protruding from the end surface 21A on the first side in the third direction of the base portion 21 toward the first side in the third direction. The heat dissipation assembly 3 has recessed portions 31A, 31B, and 31C (hereinafter, 31A and the like) that are recessed from the end surface 3A on the second side in the third direction of the heat dissipation assembly 3 toward the first side in the third direction.

Each of the protruding portion 22A and the recessed portion 31A, the protruding portion 22B and the recessed portion 31B, and the protruding portion 22C and the recessed portion 31C constitutes a set. The number of sets is three in accordance with the number of the heating elements 4A and the like. Note that the number of the sets may be a plural number other than three, or may be singular.

A wall portion W1 extending in the first direction and the third direction is provided on the first side in the second direction of the second refrigerant flow path 102. A wall portion W2 expanding in the first direction and the third direction is provided on the second side in the second direction of the second refrigerant flow path 102.

The protruding portions 22A and the like have a columnar shape extending in the second direction and are arranged from the wall portion W1 to the wall portion W2. The protruding portions 22A and the like have a quadrangular prism shape whose cross section viewed in the second direction is a quadrangle having sides extending in the first direction and the third direction. Note that the shape of the protruding portions 22A and the like is not limited to a quadrangular prism shape, and may be, for example, a trapezoidal prism shape, a semicircular prism shape, or the like in addition to that of a variation described later. Further, the protruding portions 22A and the like may be arranged in a portion in the second direction between the wall portion W1 and the wall portion W2. Furthermore, a plurality of the protruding portions 22A and the like arranged in a portion in the second direction may be arranged in the second direction.

The recessed portions 31A and the like have a quadrangular shape having sides extending in the second direction and the first direction when viewed in the third direction. The shape of the recessed portions 31A and the like is not limited to a quadrangular shape, and may be, for example, a shape in which each side extending in the first direction in the quadrangular shape is an arc shape protruding outward in the second direction. The recessed portion is formed by, for example, cutting. Since the liquid cooling jacket 2 and the heat dissipation assembly 3 are fastened by a screw or the like, the heat dissipation assembly 3 needs to be drilled with a hole through which the screw passes. Cutting of the recessed portion may be performed in accordance with the drilling. The depth of the recessed portion in the third direction is desirably 0.1 mm or more, and particularly desirably 0.2 mm or more.

When viewed in the third direction, the side on the second side in the first direction of the recessed portions 31A and the like overlaps a part of a side on the second side in the first direction of the protruding portions 22A and the like. That is, the arrangement position in the second direction of at least a part of the recessed portions 31A and the like coincide with the arrangement position in the second direction of at least a part of the protruding portions 22A and the like.

When viewed in the third direction, the heating elements 4A and the like overlap the entire recessed portions 31A and the like and a part of the protruding portions 22A and the like. When viewed in the third direction, the heating element may overlap a part of the recessed portions 31A and the like or the entire protruding portions 22A and the like.

Figure 3:
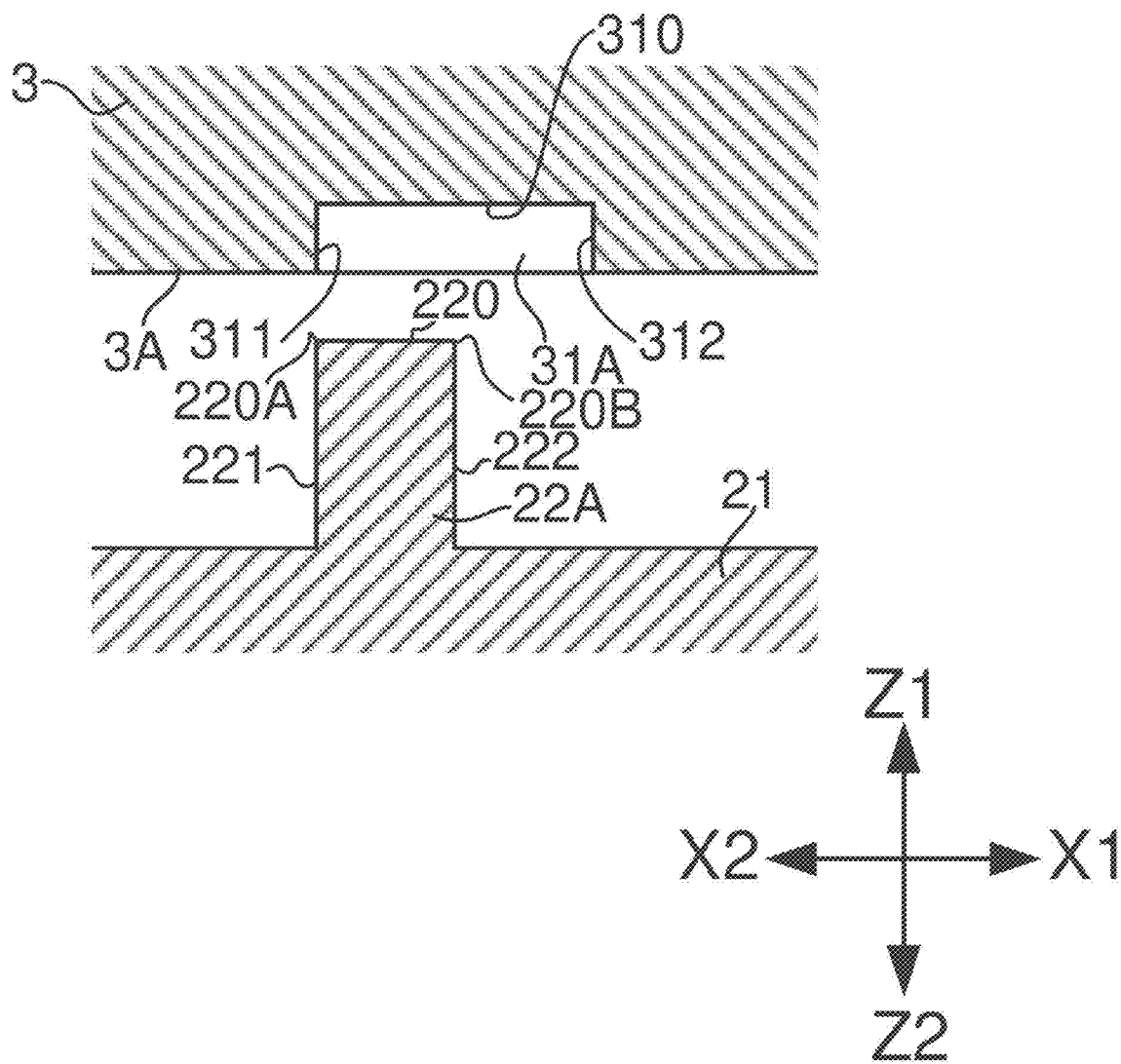
FIG. 3 is an enlarged view of a configuration in the vicinity of a protruding portion and a recessed portion illustrated in FIG. 2.

FIG. 3 is an enlarged view of a configuration in the vicinity of the protruding portion 22A and the recessed portion 31A illustrated in FIG. 2. FIG. 3 is a partial cross-sectional view taken along line I-I, and the same applies to FIGS. 4 to 10 described later. Further, the configuration illustrated in FIG. 3 is the same for the protruding portions 22B and 22C and the recessed portions 31B and 31C.

As illustrated in FIG. 3, an end surface 220 on the first side in the third direction of the protruding portion 22A is arranged further on the second side in the third direction than the end surface 3A on the second side in the third direction of the heat dissipation assembly 3. An end portion 221 on the second side in the first direction of the protruding portion 22A is arranged at the same position in the first direction as an end portion 311 on the second side in the first direction of the recessed portion 31A. That is, the end portion 221 on the second side in the first direction of the protruding portion 22A is arranged further on the second side in the first direction than an end portion 312 on the first side in the first direction of the recessed portion 31A.

A boundary layer of flow generated on the end surface 3A on the second side in the third direction of the heat dissipation assembly 3 is destroyed by a discontinuous surface of the recessed portion 31A, and flow of the refrigerant W floats from an end surface 310 on the first side in the third direction of the recessed portion 31A. Furthermore, as turbulence generated by the protruding portion 22A joins the flow in the floating state, the destruction of the boundary layer is promoted. Therefore, it is possible to improve the cooling performance for cooling the heating element 4A by the refrigerant W. Further, since the recessed portion 31A is provided in the heat dissipation assembly 3, it is not necessary to provide a cooling fin, and pressure loss and manufacturing cost can be suppressed.

As illustrated in FIG. 3, an end portion 222 on the first side in the first direction of the protruding portion 22A is arranged further on the second side in the first direction than the end portion 312 on the first side in the first direction of the recessed portion 31A. This makes it possible to arrange an end portion on the downstream side of turbulence generated by the protruding portion 22A further on the upstream side than the end portion 312 on the first side in the first direction of the recessed portion 31A, and makes it easy to destroy the boundary layer.

More specifically, the end portion 222 on the first side in the first direction of the protruding portion 22A is arranged further on the first side in the first direction than the end portion 311 on the second side in the first direction of the recessed portion 31A. This makes it easy to arrange an end portion on the downstream side of turbulence generated by the protruding 22A portion between both ends in the first direction of the recessed portion 31A, and makes it easy to destroy the boundary layer.

As illustrated in FIG. 3, the end portion 221 on the second side in the first direction of the protruding portion 22A is arranged at the same position in the first direction as the end portion 311 on the second side in the first direction of the recessed portion 31A. This makes it easy to cause turbulence generated by the protruding portion 22A to join the flow in the floating state, and makes it easy to destroy the boundary layer.

As illustrated in FIG. 3, an end portion 220A on the second side in the first direction and an end portion 220B on the first side in the first direction of the end surface 220 on the first side in the third direction of the protruding portion 22A are arranged at the same position in the third direction. In this manner, cooling performance by turbulence generated by the protruding portion 22A can be improved.

Further, in the present example embodiment, as illustrated in FIG. 2, a plurality of sets of the protruding portions 22A and the like and the recessed portions 31A and the like are arranged in the first direction. In this manner, when a plurality of heating elements such as the heating elements 4A and the like are arranged in the first direction, cooling performance for cooling the heating element can be improved.

In the configuration illustrated in FIG. 2, when viewed in the third direction, an end portion on the first side in the second direction of the recessed portion 31A is arranged further on the second side in the second direction than the wall portion W1, and an end portion on the second side in the second direction of the recessed portion 31A is arranged further on the first side in the second direction than the wall portion W2. That is, the recessed portion 31A is arranged in a portion in the second direction between both ends in the second direction of the refrigerant flow path 102. In this manner, the recessed portion 31A is not provided in a location where cooling performance is relatively unnecessary, so that it is possible to suppress a decrease in the strength of the heat dissipation assembly 3. As described above, a plurality of the recessed portions 31A arranged in a portion of the second direction may be arranged in the second direction.

As illustrated in FIG. 2, when viewed in the third direction, at least a part of the recessed portion 31A overlaps the heating element 4A that can be arranged on the first side in the third direction of the heat dissipation assembly 3. This makes it possible to improve cooling performance for cooling the heating element 4A.

As illustrated in FIG. 2, a part of the recessed portion 31A overlaps a part of the protruding portion 22A as viewed in the third direction. That is, at least a part of the recessed portion 31A overlaps at least a part of the protruding portion 22A. This makes it easy to cause turbulence generated by the protruding portion 22A to join the flow in the floating state, and makes it easy to destroy the boundary layer.

Figure 4:
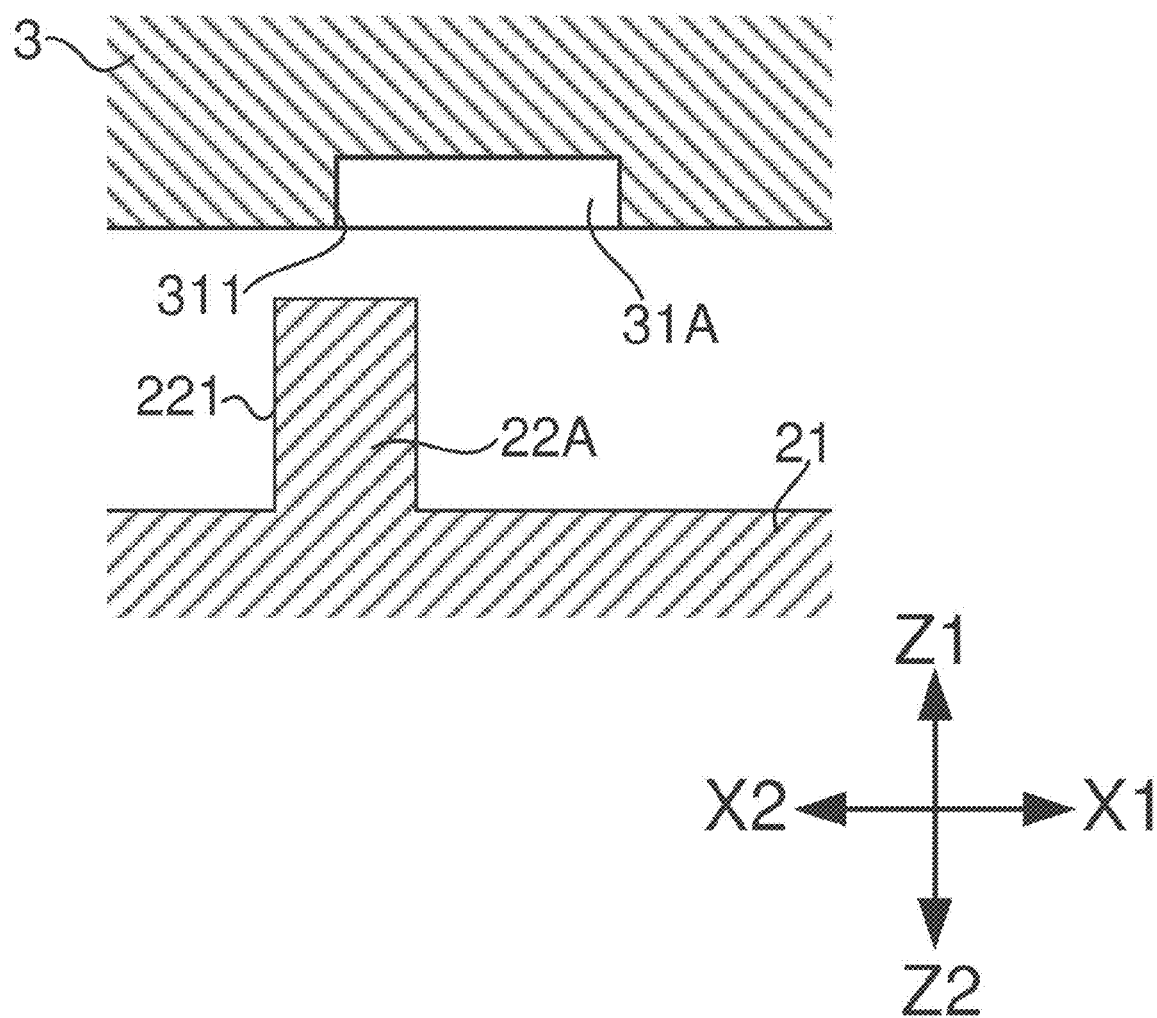
FIG. 4 is an enlarged view of a configuration in the vicinity of the protruding portion and the recessed portion in the cooling device according to a first variation of an example embodiment of the present disclosure.

FIG. 4 is an enlarged view of a configuration in the vicinity of the protruding portion 22A and the recessed portion 31A in the cooling device according to a first variation. In the present example embodiment, as a difference from FIG. 3, the end portion 221 on the second side in the first direction of the protruding portion 22A is arranged further on the second side in the first direction than the end portion 311 on the second side in the first direction of the recessed portion 31A. In this manner, the destruction of the boundary layer by turbulence generated by the protruding portion 22A can be promoted, and the cooling performance can be improved.

Figure 5:
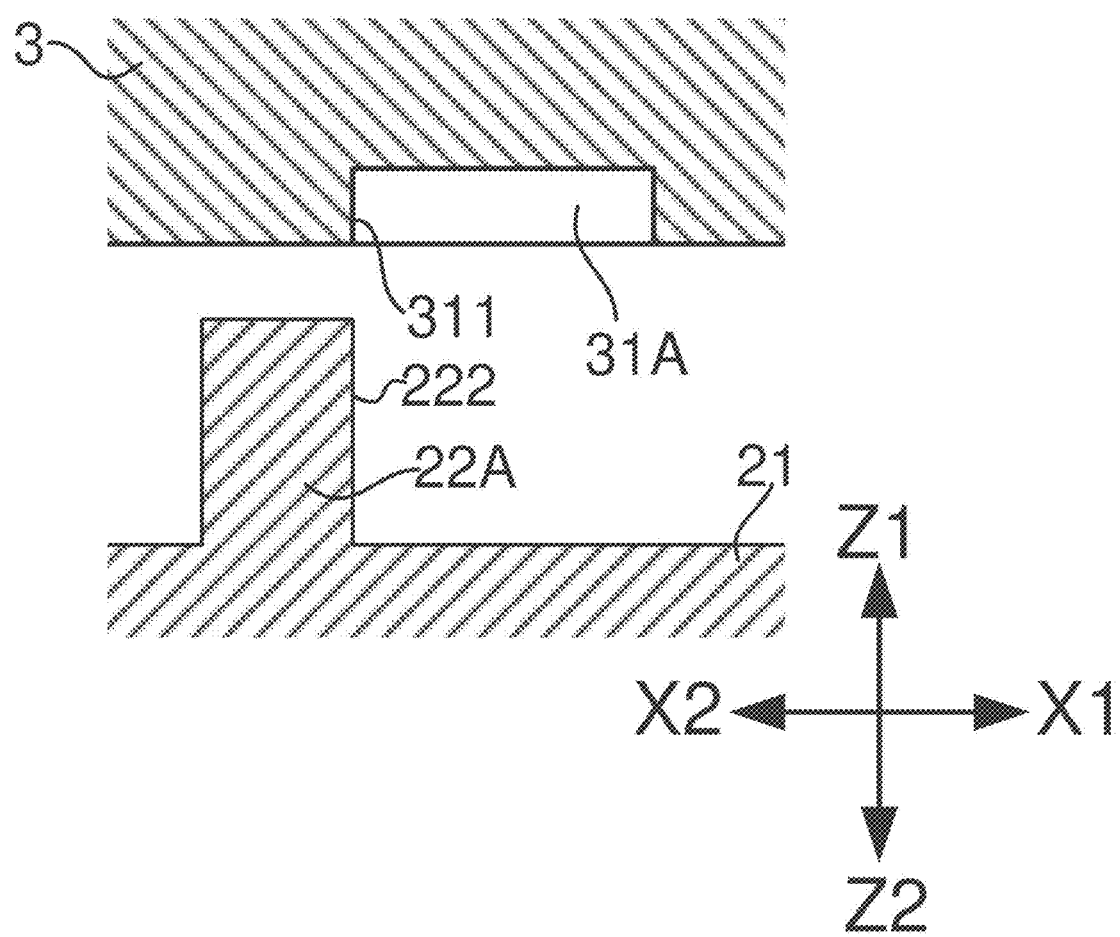
FIG. 5 is an enlarged view of a configuration in the vicinity of the protruding portion and the recessed portion in the cooling device according to a second variation of an example embodiment of the present disclosure.

FIG. 5 is an enlarged view of a configuration in the vicinity of the protruding portion 22A and the recessed portion 31A in the cooling device according to a second variation. In the present example embodiment, as a difference from FIG. 3, the end portion 222 on the first side in the first direction of the protruding portion 22A is arranged at the same position in the first direction as the end portion 311 on the second side in the first direction of the recessed portion 31A. This makes it easy to arrange an end portion on the downstream side of turbulence generated by the protruding portion 22A between both ends in the first direction of the recessed portion 31A, and makes it easy to destroy the boundary layer.

Figure 6:
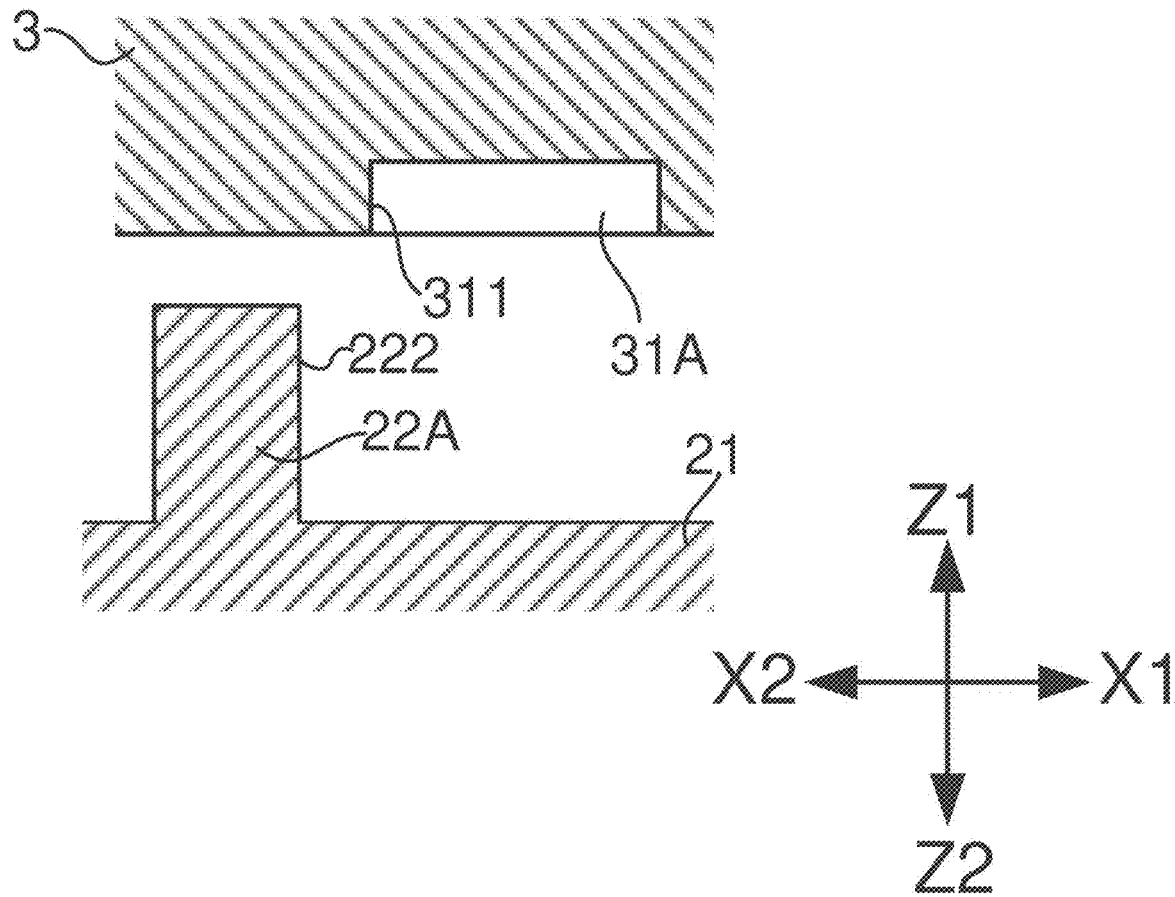
FIG. 6 is an enlarged view of a configuration in the vicinity of the protruding portion and the recessed portion in the cooling device according to a third variation of an example embodiment of the present disclosure.

FIG. 6 is an enlarged view of a configuration in the vicinity of the protruding portion 22A and the recessed portion 31A in the cooling device according to a third variation. In the present example embodiment, as a difference from FIG. 3, the end portion 222 on the first side in the first direction of the protruding portion 22A is arranged further on the second side in the first direction than the end portion 311 on the second side in the first direction of the recessed portion 31A.

Figure 7:
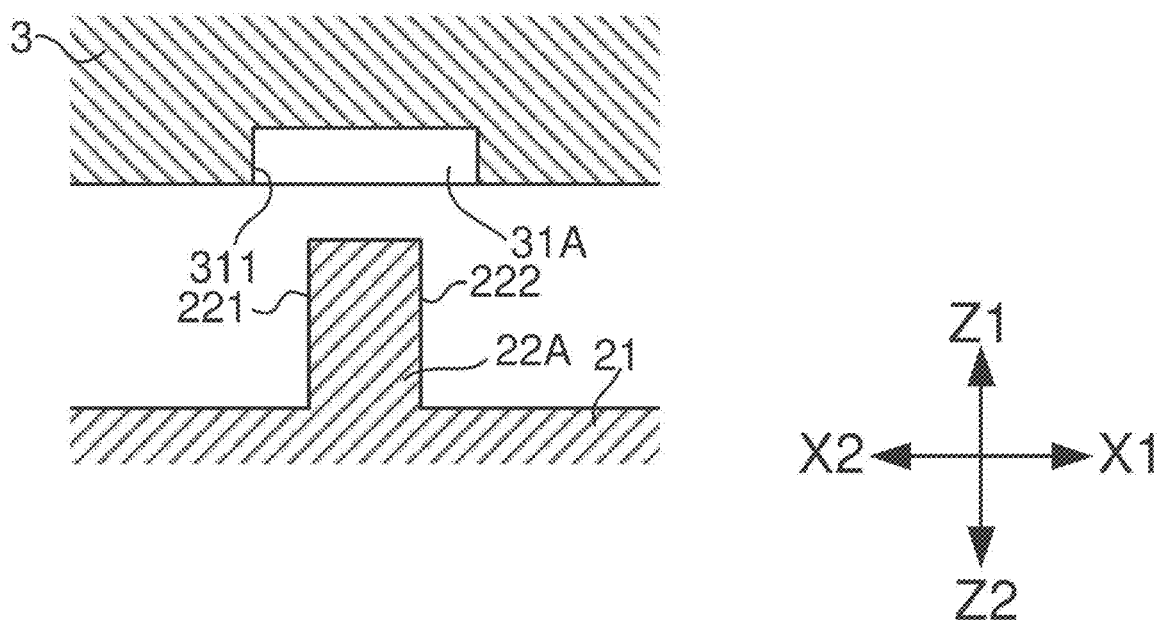
FIG. 7 is an enlarged view of a configuration in the vicinity of the protruding portion and the recessed portion in the cooling device according to a fourth variation of an example embodiment of the present disclosure.

FIG. 7 is an enlarged view of a configuration in the vicinity of the protruding portion 22A and the recessed portion 31A in the cooling device according to a fourth variation. In the present example embodiment, as a difference from FIG. 3, the end portion 221 on the second side in the first direction of the protruding portion 22A is arranged further on the first side in the first direction than the end portion 311 on the second side in the first direction of the recessed portion 31A. This makes it easy to cause turbulence generated by the protruding portion 22A to join the flow in the floating state, and makes it easy to destroy the boundary layer.

Figure 8:
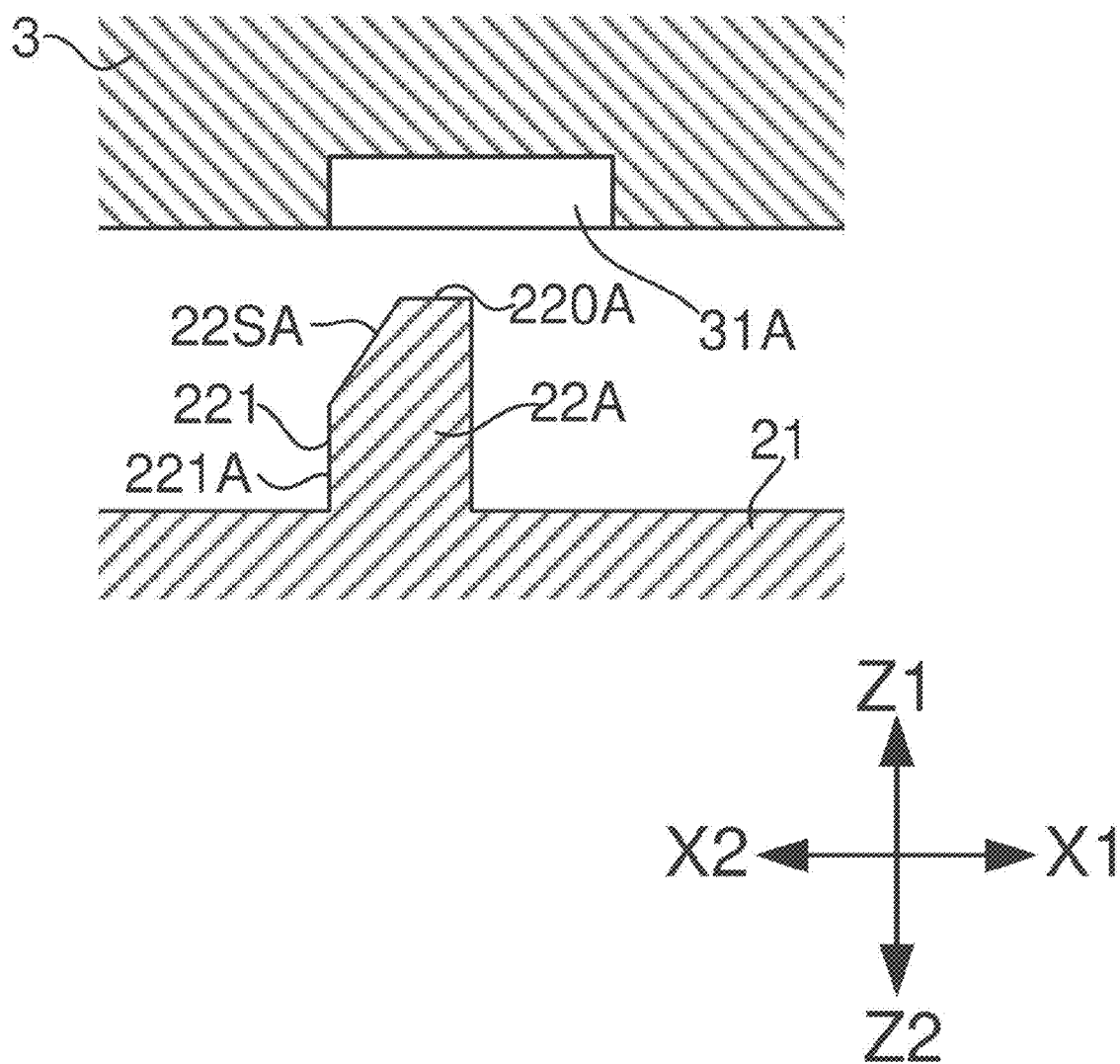
FIG. 8 is an enlarged view of a configuration in the vicinity of the protruding portion and the recessed portion in the cooling device according to a fifth variation of an example embodiment of the present disclosure.

FIG. 8 is an enlarged view of a configuration in the vicinity of the protruding portion 22A and the recessed portion 31A in the cooling device according to a fifth variation. In the present example embodiment, as a difference from FIG. 3, the protruding portion 22A has a first inclined surface 22SA. The first inclined surface 22SA is inclined to the first side in the first direction and the first side in the third direction, and extends from the end portion 221 on the second side in the first direction of the protruding portion 22A to the first side in the first direction. With the first inclined surface 22SA, pressure loss can be reduced. More specifically, the first inclined surface 22SA extends from an end on the first side in the third direction of an end surface 221A on the second side in the first direction of the protruding portion 22A to an end on the second side in the first direction of the end surface 220A on the first side in the third direction of the protruding portion 22A.

Figure 9:
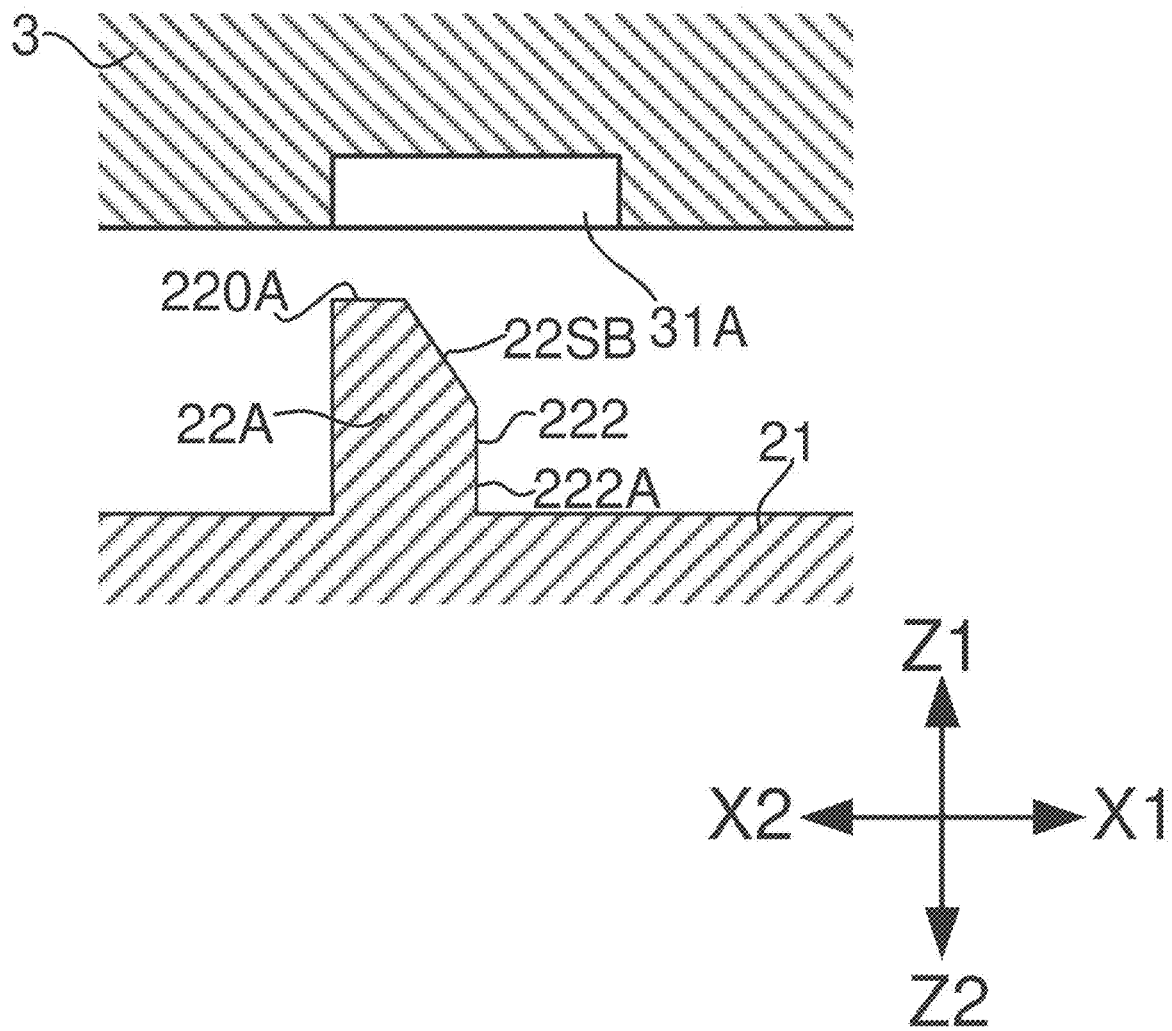
FIG. 9 is an enlarged view of a configuration in the vicinity of the protruding portion and the recessed portion in the cooling device according to a sixth variation of an example embodiment of the present disclosure.

FIG. 9 is an enlarged view of a configuration in the vicinity of the protruding portion 22A and the recessed portion 31A in the cooling device according to a sixth variation. In the present example embodiment, as a difference from FIG. 3, the protruding portion 22A has a second inclined surface 22SB. The second inclined surface 22SB is inclined to the second side in the first direction and the first side in the third direction, and extends from the end portion 222 on the first side in the first direction of the protruding portion 22A to the second side in the first direction. This makes it possible to improve cooling performance while reducing pressure loss. More specifically, the second inclined surface 22SB extends from an end on the first side in the third direction of an end surface 222A on the first side in the first direction of the protruding portion 22A to an end on the first side in the first direction of the end surface 220A on the first side in the third direction of the protruding portion 22A.

Figure 10:
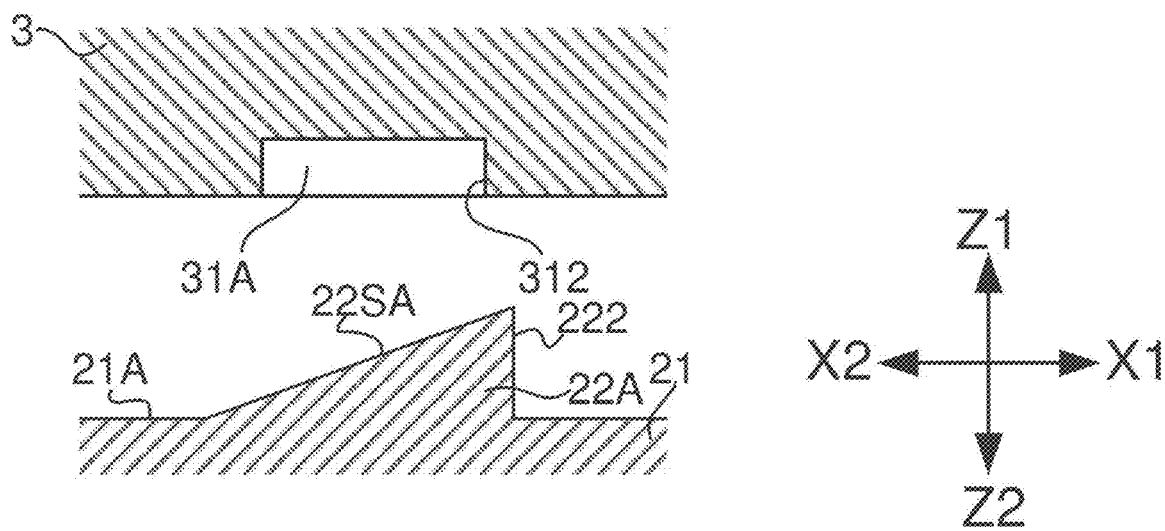
FIG. 10 is an enlarged view of a configuration in the vicinity of the protruding portion and the recessed portion in the cooling device according to a seventh variation of an example embodiment of the present disclosure.

FIG. 10 is an enlarged view of a configuration in the vicinity of the protruding portion 22A and the recessed portion 31A in the cooling device according to a seventh variation. In the present example embodiment, as a difference from FIG. 8, the first inclined surface 22SA extends from the end surface 21A on the first side in the third direction of the base portion 21 to the first side in the first direction. In the configuration illustrated in FIG. 10, the end portion 222 on the first side in the first direction of the protruding portion 22A is arranged further on the first side in the first direction than an end portion on the first side in the first direction of the recessed portion 31A.

Figure 11:
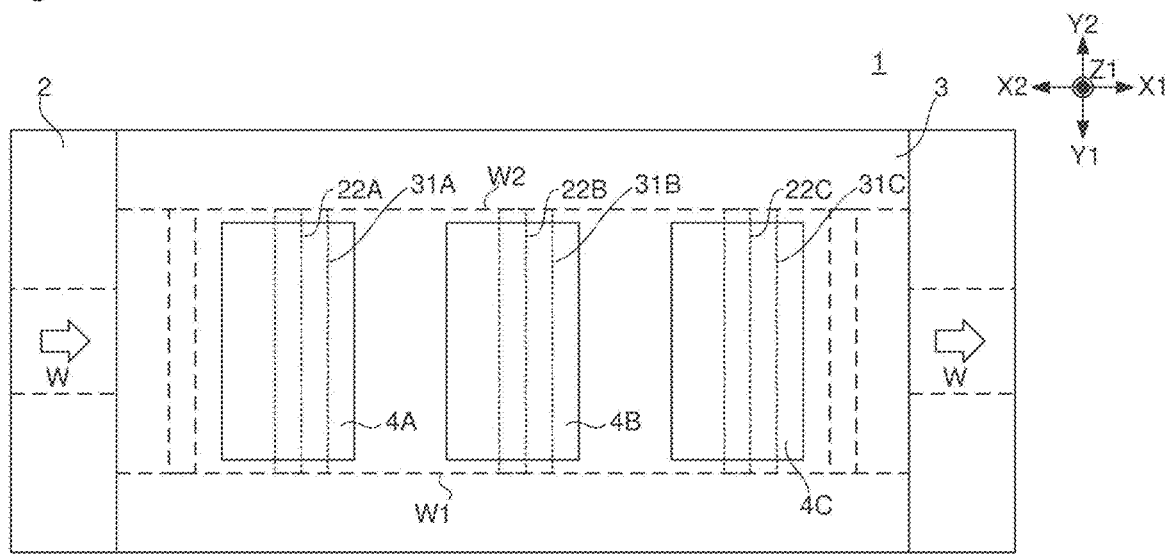
FIG. 11 is a plan view of the cooling device according to an eighth variation of an example embodiment of the present disclosure as viewed from a first side in a third direction.

FIG. 11 is a plan view of the cooling device 1 according to an eighth variation as viewed from the first side in the third direction. In the present example embodiment, as a difference from FIG. 2, the recessed portions 31A and the like are arranged from the wall portion W1 to the wall portion W2 as viewed in the third direction. That is, the recessed portions 31A and the like are arranged in the entire second direction between both ends in the second direction of the refrigerant flow path 102. In this manner, for example, the heating elements 4A and the like arranged over a wide range in the second direction as illustrated in FIG. 11 can be easily cooled.

Figure 12:
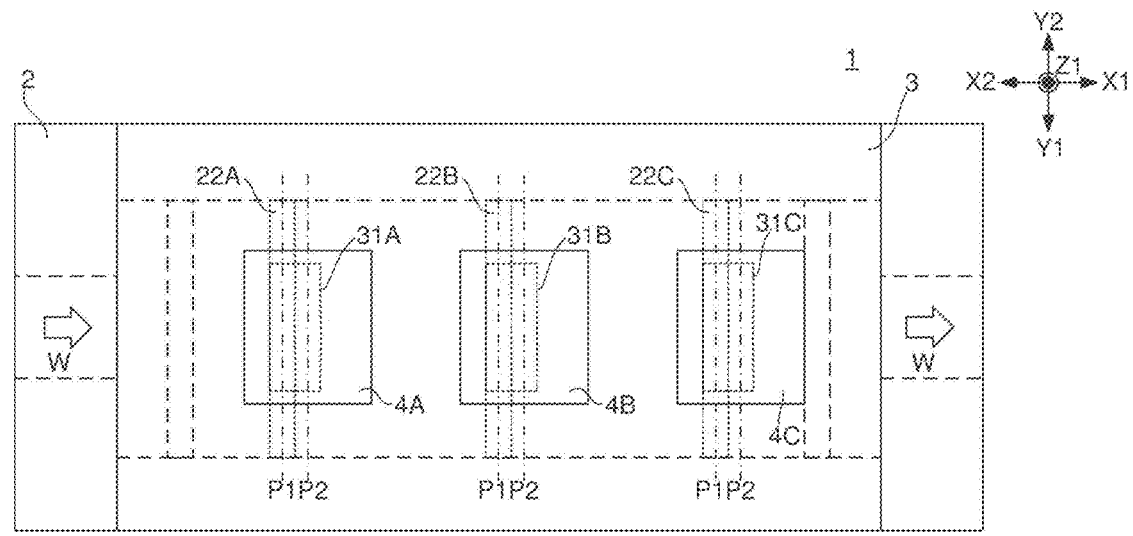
FIG. 12 is a plan view of the cooling device according to a ninth variation of an example embodiment of the present disclosure as viewed from the first side in the third direction.

FIG. 12 is a plan view of the cooling device 1 according to a ninth variation as viewed from the first side in the third direction. In the present example embodiment, as a difference from FIG. 2, a center position P1 in the first direction of the protruding portions 22A and the like is located further on the second side in the first direction than a center position P2 in the first direction of the heating elements 4A and the like. Since a heat transfer coefficient is high further on the downstream side than the recessed portions 31A and the like in addition to a location of the recessed portions 31A and the like, it is possible to further improve the cooling performance for cooling the heating elements 4A and the like by setting a positional relationship between the center positions P1 and P2 in the first direction as described above.

The example embodiment of the present disclosure is described above. Note that the scope of the present disclosure is not limited to the above example embodiment. The present disclosure can be implemented by making various changes to the above-described example embodiment without departing from the gist of the disclosure. The matters described in the above example embodiment can be optionally combined together, as appropriate, as long as there is no inconsistency.

For example, the heat dissipation assembly is not limited to a metal plate, and may be a vapor chamber or a heat pipe.

The present disclosure can be used for cooling various heating elements.

Features of the above-described preferred example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A cooling device comprising:
a liquid cooling jacket; and
a heat dissipation assembly on a first side in a third direction of the liquid cooling jacket; wherein
a direction along which a refrigerant flows is defined as a first direction, a direction orthogonal to the first direction is defined as a second direction, and a direction orthogonal to the first direction and the second direction is defined as the third direction;
a downstream side is defined as a first side in the first direction, and an upstream side is defined as a second side in the first direction;
the liquid cooling jacket includes:
a base portion; and
a protruding portion protruding from an end surface on the first side in the third direction of the base portion to the first side in the third direction;
the heat dissipation assembly includes a recessed portion recessed from an end surface on a second side in the third direction of the heat dissipation assembly to the first side in the third direction;
a refrigerant flow path having a width in the second direction is between the end surface on the first side in the third direction of the base portion and the end surface on the second side in the third direction of the heat dissipation assembly;
a position in the second direction of at least a portion of the recessed portion coincides with a position in the second direction of at least a portion of the protruding portion; and
an end portion on the second side in the first direction of the protruding portion is farther on the second side in the first direction than an end portion on the first side in the first direction of the recessed portion.

2. The cooling device according to claim 1, wherein an end portion on the first side in the first direction of the protruding portion is farther on the second side in the first direction than the end portion on the first side in the first direction of the recessed portion.

3. The cooling device according to claim 2, wherein the end portion on the first side in the first direction of the protruding portion is at a same position in the first direction as an end portion on the second side in the first direction of the recessed portion or farther on the first side in the first direction than the end portion on the second side in the first direction of the recessed portion.

4. The cooling device according to claim 1, wherein the end portion on the second side in the first direction of the protruding portion is at a same position in the first direction as the end portion on the second side in the first direction of the recessed portion or farther on the first side in the first direction than the end portion on the second side in the first direction of the recessed portion.

5. The cooling device according to claim 1, wherein the end portion on the second side in the first direction of the protruding portion is farther on the second side in the first direction than the end portion on the second side in the first direction of the recessed portion.

6. The cooling device according to claim 1, wherein an end portion on the second side in the first direction and an end portion on the first side in the first direction of an end surface on the first side in the third direction of the protruding portion are at a same position in the third direction.

7. The cooling device according to claim 1, wherein
the protruding portion includes a first inclined surface; and
the first inclined surface is inclined to the first side in the first direction and the first side in the third direction, and extends from the end portion on the second side in the first direction of the protruding portion to the first side in the first direction.

8. The cooling device according to claim 7, wherein the first inclined surface extends from an end on the first side in the third direction of an end surface on the second side in the first direction of the protruding portion to an end on the second side in the first direction of an end surface on the first side in the third direction of the protruding portion.

9. The cooling device according to claim 1, wherein
the protruding portion includes a second inclined surface; and
the second inclined surface is inclined to the second side in the first direction and the first side in the third direction, and extends from the end portion on the first side in the first direction of the protruding portion to the second side in the first direction.

10. The cooling device according to claim 9, wherein the second inclined surface extends from an end on the first side in the third direction of an end surface on the first side in the first direction of the protruding portion to an end on the first side in the first direction of the end surface on the first side in the third direction of the protruding portion.

11. The cooling device according to claim 1, wherein a plurality of sets of the protruding portion and the recessed portion are located along the first direction.

12. The cooling device according to claim 1, wherein the recessed portion is in a portion in the second direction between two ends in the second direction of the refrigerant flow path.

13. The cooling device according to claim 1, wherein the recessed portion is provided entirely within two ends in the second direction of the refrigerant flow path.

14. The cooling device according to claim 1, wherein at least a portion of the recessed portion overlaps a heating element that is on the first side in the third direction of the heat dissipation assembly as viewed in the third direction.

15. The cooling device according to claim 14, wherein a center position in the first direction of the protruding portion is located farther on the second side in the first direction than a center position in the first direction of the heating element.

16. The cooling device according to claim 1, wherein at least a portion of the recessed portion overlaps at least a portion of the protruding portion as viewed in the third direction.

* * * * *